(12) United States Patent
Poletto et al.

(10) Patent No.: US 7,133,482 B2
(45) Date of Patent: Nov. 7, 2006

(54) DECODING METHOD AND MANCHESTER DECODER

(75) Inventors: Vanni Poletto, Casale Monferrato (IT); Paolo Ghigini, Cava Manara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 779 days.

(21) Appl. No.: 10/395,040

(22) Filed: Mar. 21, 2003

(65) Prior Publication Data

US 2003/0227987 A1    Dec. 11, 2003

(30) Foreign Application Priority Data

Mar. 22, 2002   (EP) .................................. 02425178

(51) Int. Cl.
   *H04L 7/02* (2006.01)
(52) U.S. Cl. ....................................... 375/361; 341/70
(58) Field of Classification Search ................. 375/340, 375/360, 361; 341/68, 69, 70
   See application file for complete search history.

(56) References Cited

U.S. PATENT DOCUMENTS

| | | | | |
|---|---|---|---|---|
| 4,363,002 A | | 12/1982 | Fuller | 331/1 A |
| 5,168,511 A | | 12/1992 | Boles | 375/82 |
| 5,170,396 A | | 12/1992 | Rivers et al. | 371/6 |
| 5,224,126 A | | 6/1993 | Myers et al. | 375/87 |
| 5,627,828 A | * | 5/1997 | Lee | 370/445 |
| 6,008,746 A | * | 12/1999 | White | 341/70 |
| 6,977,973 B1 | * | 12/2005 | Wiggins | 375/333 |

* cited by examiner

*Primary Examiner*—Dac V. Ha
(74) *Attorney, Agent, or Firm*—Lisa K. Jorgenson; Allen, Dyer, Doppelt, Milbrath & Gilchrist, P.A.

(57) ABSTRACT

A method and a corresponding decoder for decoding a Manchester encoded binary data signal includes receiving the Manchester encoded binary data signal having a first sequence of central bit transitions and a second sequence of initial bit transitions. A local clock signal is generated, and the central bit transitions of the Manchester encoded binary data signal are determined. Determination of the central bit transitions includes measuring the time interval elapsing between a pair adjacent central bit transitions, expressed as a number N of cycles of the local clock signal, and selecting each successive central bit transition based upon the time interval N measured between the pair of central bit transitions which immediately precede the successive central bit transition.

43 Claims, 6 Drawing Sheets

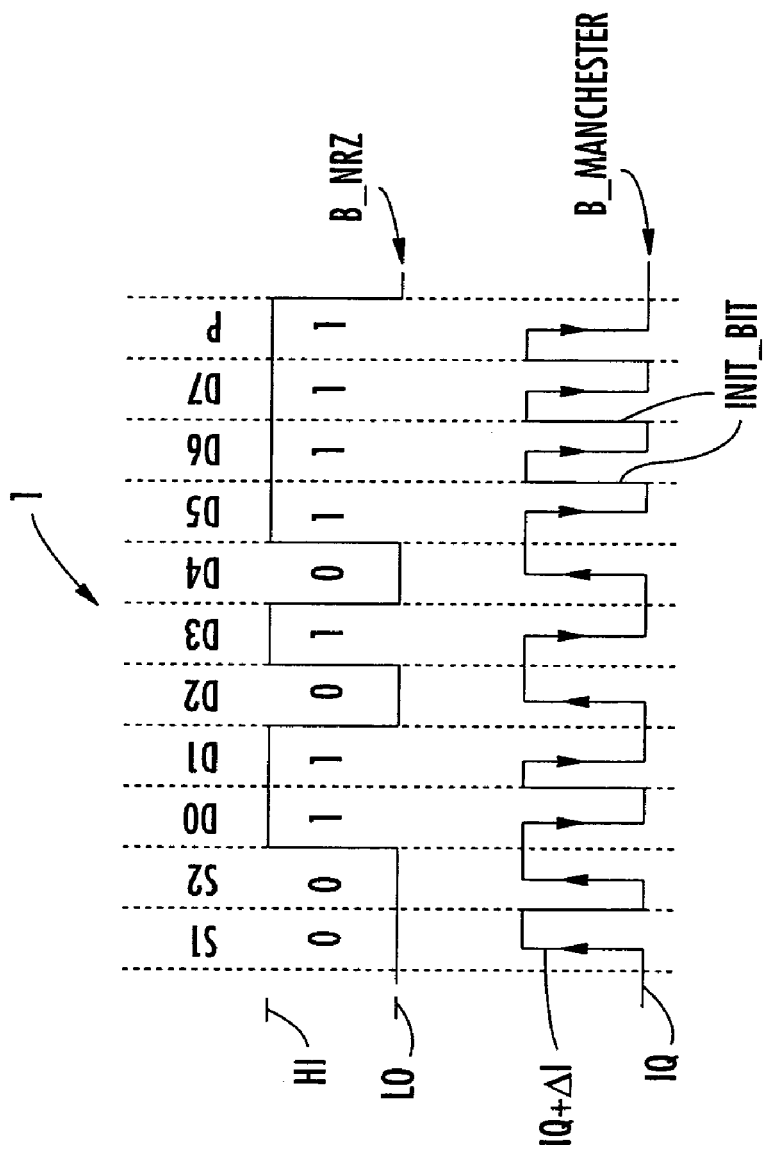
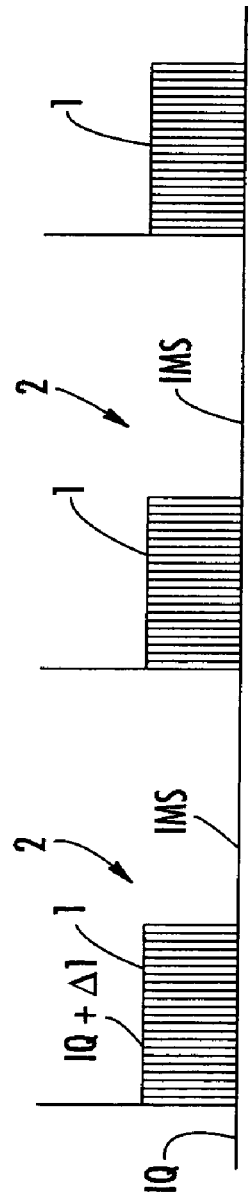
FIGURE 1a (PRIOR ART)
FIGURE 1b (PRIOR ART)

DECODING METHOD AND MANCHESTER DECODER

FIELD OF THE INVENTION

The present invention relates to the digital transmission of data, and more particularly, to a decoding method and a Manchester decoder.

BACKGROUND OF THE INVENTION

The use of Manchester encoded binary data in continuous or packet transmission of data is well-known, for example. In Manchester encoding, the code word 10 is associated to data or a bit with a logic value 1, while the code word 01 is associated to data with a logic value 0. In this way, the bits with a logic level 1 are encoded with a high level signal during the first half of the bit period and with a low level signal during the second half. On the contrary, bits with a logic level 0 are encoded with a low level signal during the first half of the bit period and with a high level signal during the second half. Consequently, there is always a transition at the center of each bit: low-to-high (upwards) for a logic 0 and high-to-low (downwards) for a logic 1.

A Manchester encoded binary data signal further includes transition at a bit start but only between adjacent bits with the same logic value. Typically, to obtain a Manchester encoded binary data signal, a clock signal having a frequency equal to the data transmission rate and the data signal are combined in an exclusive-OR logic OR gate EX-OR. The Manchester encoded data stream outputs from this gate. For simplicity, this data will be referred to hereinafter as Manchester data. Therefore, the transmission of a signal with Manchester data requires a data transmission rate twice that of the data stream before encoding.

One advantage deriving from the use of this encoding is that it is easier to recover the synchronization (clock) signal on reception, due to the high number of transitions in the encoded data. Another advantage derives from the possibility of detecting errors in the input data stream as violations of the permissible code sequence, (for example, the codes 00 and 11 are errors).

Numerous widely-used ways of decoding Manchester data on the reception side are well known. For example, it is possible to decode a Manchester data signal by accurately extracting the clock signal and then combine it in an EX-OR gate with the Manchester data. The binary data are obtained at the gate output.

This method has a disadvantage in that the clock signal to be recovered from the data must always be in phase with the received data. In this sense, the presence of jitters on the received data, in other words, fluctuations in the length of the bit period, presents a serious disadvantage.

Moreover, known systems for synchronization recovery require numerous training or preamble bits to reach a locking condition. These training bits are transmitted before the data. They do not carry information, and their function is to carry out synchronization. For this reason phase recovery is particularly disadvantageous for packet transmission, since it causes a considerable waste in transmission, especially if the packets include only a few bits.

Decoding methods not based on clock recovery are also known, such as described in U.S. Pat. No. 4,361,895. This method does not make use of clock recovery and requires over-sampling of the signal to be decoded and clocked by a local frequency reference. Decoding takes place by examining the value of samples in certain positions. The position of the samples is determined by using a local counter which counts the number of cycles of the local frequency reference, reset and started by the transitions at the center of every bit of the coded signal.

The decoders which use this method require a time reference (clock frequency) having very high precision both in transmission and in reception. For this reason, the performance of the decoders is compromised by aging and the thermal drift of the local references. Moreover, these decoders are not very tolerant of variations in the bit rate used in transmission and jitter.

SUMMARY OF THE INVENTION

In view of the foregoing background, an object of the present invention is to provide a method to decode Manchester encoded data which does not possess the disadvantages of the above-described methods known in the art.

This object is achieved by a decoding method, comprising receiving a Manchester encoded binary data signal, and generating a local clock signal. The encoded binary data signal has a sequence of central bit transitions and a sequence of initial bit transitions. The method may further comprise determining the sequence of central bit transitions by measuring a time interval between a pair of adjacent central bit transitions. The time interval may be expressed as a number of cycles of the local clock signal. Each successive central bit transition may be selected based upon the time interval measured between the pair of adjacent central bit transitions which immediately precede the successive central bit transition to be selected.

Another aspect of the present invention is directed to a decoder comprising a generator for supplying a local clock signal, and a first state machine for generating a first signal having pulses corresponding to the sequence of central bit transitions. The first signal may be obtained from the encoded binary data signal.

The decoder may further comprise a counter for measuring a time interval between two adjacent central bit transitions. The counter is increased by the local clock signal. The first state machine generates a second signal having pulses corresponding to both the sequence of central bit transitions and the sequence of initial bit transitions. The first state machine may also select each successive central bit transition, and eliminate from the second signal pulses corresponding to an initial bit transition which precedes each successive central bit transition to be selected. Elimination of the initial bit transition may be based upon a time interval measured between a pair of selected adjacent central bit transitions which immediately precede the successive central bit transition.

BRIEF DESCRIPTION OF THE DRAWINGS

Further aspects and advantages of the invention will be more apparent by the following detailed description of a preferred embodiment, given as a non-limiting example, in conjunction with the accompanying drawings, in which:

FIGS. 1a and 1b schematically show the structure of a packet and a message used in the PAS (Peripheral Acceleration Sensor) protocol;

FIG. 2b shows one embodiment of a filter used with the decoder illustrated in FIG. 2a;

FIGS. 3a, 3b and 4 show waveforms of the signals used in the decoder illustrated in FIG. 2a;

FIG. 5a shows an end-of-message state machine used in the decoder illustrated in FIG. 2a.

DETAILED DESCRIPTION OF THE PREFERRED EMBODIMENTS

Figure 2A:
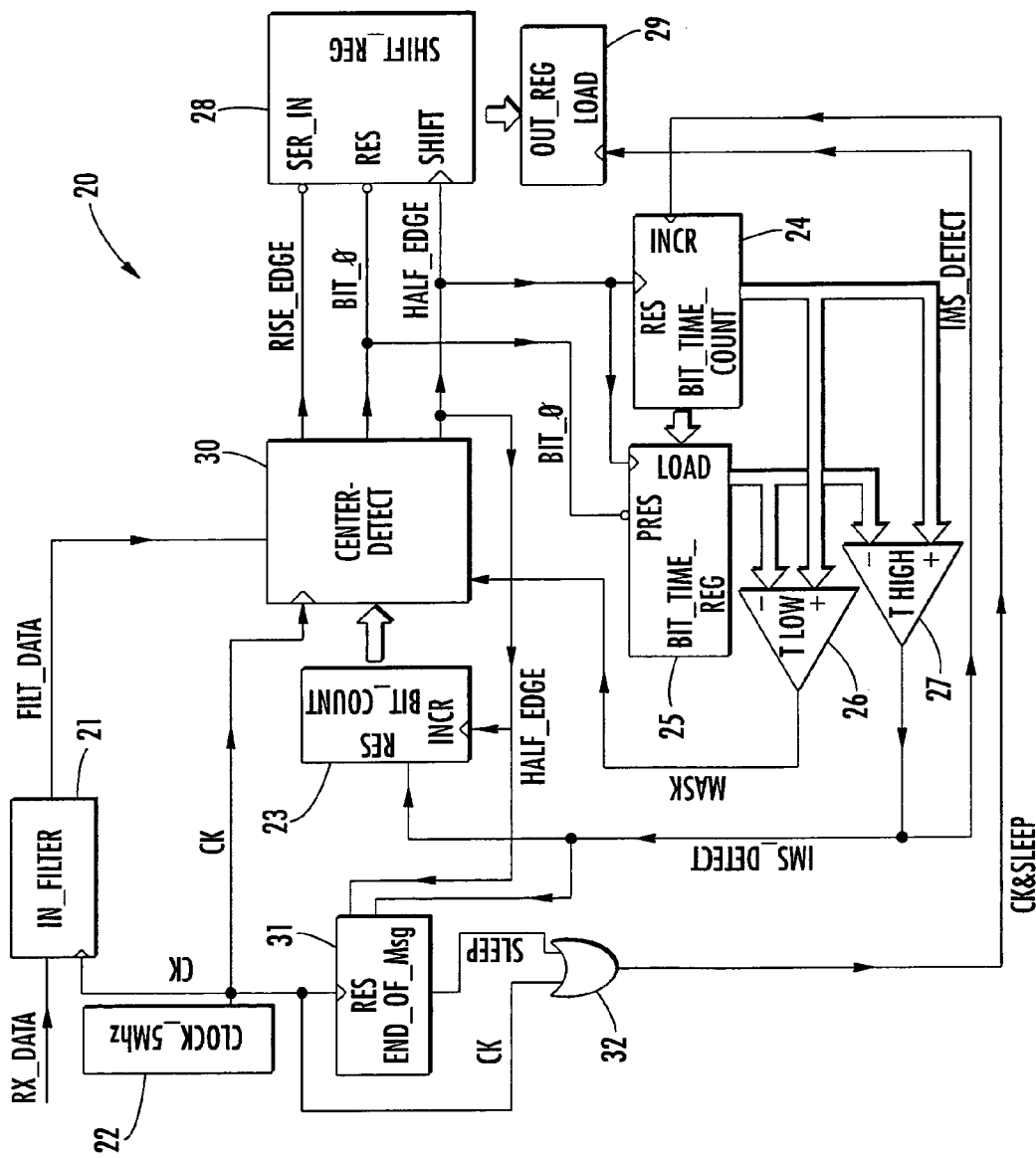
FIG. 2a schematically shows a block diagram of a Manchester decoder according to the present invention.

The preferred embodiment of this invention described below refers to the serial transmission of Manchester encoded packet data as used by the PAS (Peripheral Acceleration Sensors) protocol. The teachings of the present invention can also be extended to the decoding of Manchester data used in applications different from those referred below.

The PAS protocol is an industrial standard for the transmission of accelerometric data from a remote sensor to a central processing unit and is used, for example, in vehicle airbag systems. These systems comprise accelerometric sensors generally placed on the front of the vehicle. Each one of these communicates its acceleration value to a central unit modulating the current in a double-wire serial line.

Each acceleration sample is transmitted in the form of a data packet, with Manchester type encoding. In FIG. 1a, a data packet 1 is indicated with B_NRZ, for example, of the type produced by an acceleration sensor before Manchester encoding. The packet B_NRZ of 11 bits is represented in the known NRZ form (Non-Return-To-Zero), in which a high current level Hi corresponds to a logic value 1, and a low current level Lo corresponds to a logic value 0.

The packet 1 always begins with two start bits S1 and S2, which are logic zero and are used to synchronize the start of reception of the packet 1. Then 8–10 data bits follow, in this example 8 bits D0–D7, which contain the acceleration rate measured by the sensor. A parity bit P preferably terminates the packet to enable error control during reception.

With reference again to FIG. 1a, the packet 1 after Manchester encoding is represented as B_Manchester. Transmission from the sensor to the central unit takes place by modulating the current in the double-wire line on two levels IQ and IQ+ΔI. As said previously, the B_Manchester packet comprises transitions at the center of the bit with a rising edge and a falling edge (indicated with an arrow in the figure) corresponding to a logic 0 and a logic 1. Moreover, the B_Manchester packet comprises transitions at the start of the bit Init_Bit, which are not useful for decoding.

As can be seen in FIG. 1b, between the packet 1 and the following, there is a time interval with a low current level called IMS (Inter Message Space). The packet 1 together with the following IMS space is called a message 2. The duration of a bit is typically 8 μs.

FIG. 2a schematically shows a preferred embodiment of a Manchester decoder according to the invention for decoding a signal with data in bit packets according to the form of the previously described PAS protocol. In this embodiment, the decoder, indicated with numeral 20, comprises a filter 21 In_Filter, a clock signal generator 22 Clock_5 MHz, a first counter device 23 Bit_Count, and a second counter device 24 Bit_Time_Count.

The decoder 20 further comprises a memory, such as a register 25 Bit_Time_Reg, a shift register 28 Shift_Reg, and an output register 29 Out_Reg. The decoder 20 is also provided with a first state machine Center_Detect 30, a second state machine End_Of_Msg 31, and first and second comparators 26, 27. The clock generator 22 generates a time reference, in this example a signal CK having a frequency equal to 5 MHz.

The filter 21 In_Filter is optional and is provided with two inputs for receiving the clock CK signal and the received Manchester data signal RX_DATA, and is further provided with an output for the signal with filtered data FILT_DATA. This data corresponds to the received data RX_DATA with disturbances of various kinds eliminated, such as interference on the double-wire line, for example. One possible implementation of the filter 21 will be described with reference to FIGS. 2b and 3a.

The first state machine 30 Center_Detect is provided with inputs for receiving the filtered data signal FILT_DATA, the time signal CK and a masking signal MASK. The state machine 30 is used for generating a first signal HALF_EDGE comprising pulses corresponding to the transitions at the center of each bit of the signal FILT_DATA.

Figure 5A:
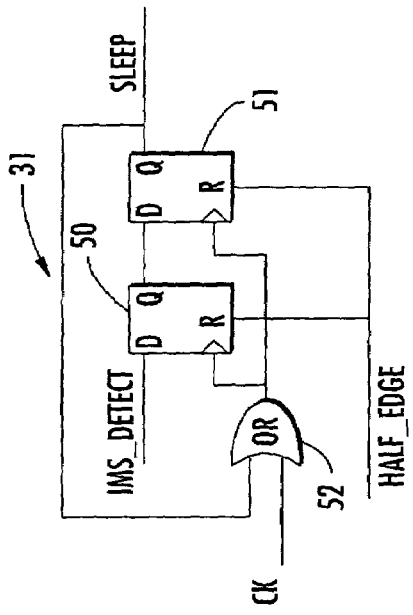
Figure 5B:
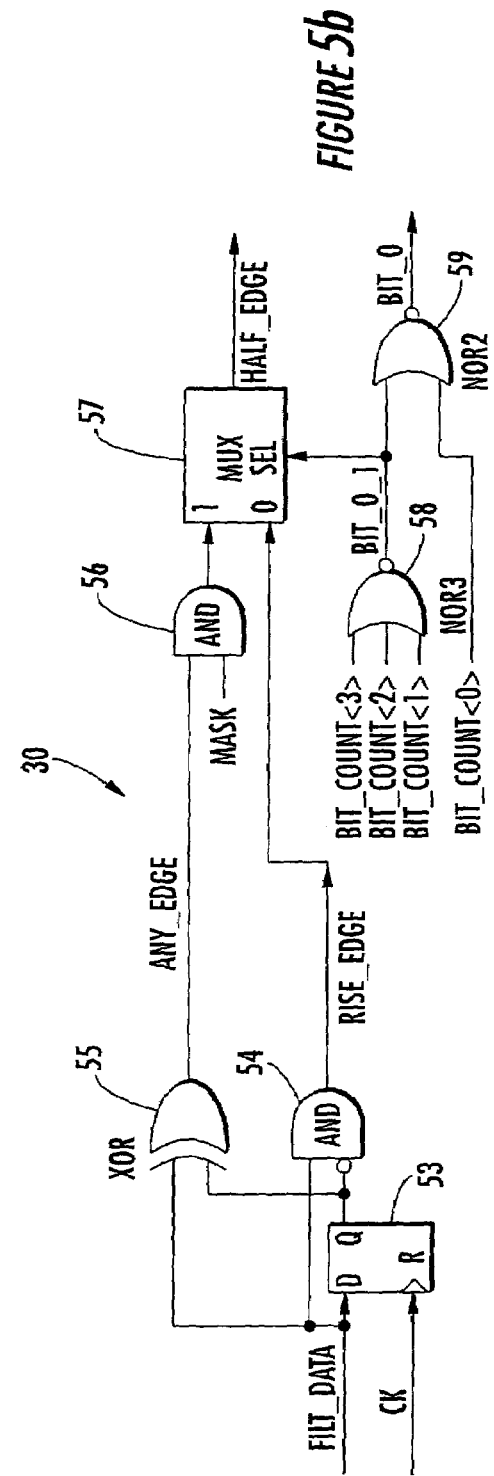
FIG. 5b shows a state machine used in the decoder illustrated in FIG. 2a for detecting the bit center.

According to an embodiment illustrated in FIG. 5b, the state machine 30 further comprises means for generating a second signal ANY_EDGE having pulses corresponding to all transitions of the signal FILT_DATA. The means can be formed by a sequential logic network including, for example, a flip-flop 53 timed by the clock signal CK and a logic gate EX-OR 55.

Furthermore, the state machine 30 is provided with masking means for selecting pulses of the second signal ANY_EDGE corresponding to transitions at the center of each bit of the signal FILT_DATA in order to generate the first signal HALF_EDGE. For example, the masking means can include a logic gate AND 56 for combining the masking signal MASK with the second signal ANY_EDGE.

In the particular example given, the masking means further comprise a multiplexer MUX 57 for receiving the output signal from the logic gate AND 56 and a third signal RISE_EDGE on appropriate inputs (indicated in the figure with 1 and 0). The multiplexer 57, on the basis of a selection signal produced by a logic gate NOR3 58, enables transmission of the signals present on the outputs to form the signal HALF_EDGE.

Moreover, the state machine 30 Center_Detect enables generation of the third signal RISE_EDGE, output to a logic gate AND 54 and containing pulses corresponding to the rising transitions of the signal FILT_DATA, and a signal BIT_0 (output to a logic gate NOR2 59) which signals when the counter 23 Bit_Count contains the value 0.

With reference to FIG. 2a, the function of the first counter device, for example a conventional counter 23 Bit_Count, is to keep count of the number of bits received in a message 2 and is provided with inputs INCR and RES to be increased by the signal HALF_EDGE and reset by the signal IMS-Detect respectively.

The second counter device, for example a conventional counter 24 Bit_Time_Count, is such that it counts the number of cycles of the clock signal CK which occur between two successive pulses of the signal HALF_EDGE. For this purpose, the circuit 24 is provided with an input INCR to be increased by the clock signal CK and an input RES to be reset by a pulse of the signal HALF_EDGE. In this example, the counter 24 Bit_Time_Count is an 8 bit counter.

A second state machine End_Of_Msg 31 is used for preventing an increase in the counter 24 when the decoder has received the end-of-packet 1, by generating a SLEEP signal which acts through the OR gate 32. A possible embodiment of the second state machine 31 will now be described with reference to FIG. 5a.

The register 25 Bit_Time_Reg, in this example with 7 bits, stores the contents of the counter 24. In particular, indicating with $T_{n-1}$, $T_n$, $T_{n+1}$ three successive central transitions of the signal FILT_DATA, corresponding to three successive pulses of the first signal HALF_EDGE, while the counter 24 measures the time interval elapsing between transitions $T_n$ and $T_{n+1}$, that is, while counting the number of clock cycles between these transitions, the register Bit_ Time_Reg 25 stores the value of the time interval elapsing between the transitions $T_{n-1}$ and $T_n$ previously measured.

The block 28, Shift_Reg in this example, is a 11 bit shift register. The register receives the three signals produced by the state machine Center_Detect 30 and serially stores the already decoded data of a particular packet 1.

The shift register 28 transfers its contents at the end of each message 2, that is, following activation of the end-of-message signal IMS_Detect, to the output register 29, for example of the 11 bit type, to which it is connected. In a preferred embodiment the registers are of a size (in terms of bits) equal to the number of bits of the packet 1.

The first comparator 26 is provided with two inputs (indicated in FIG. 2a with the conventional signs + and −) connected respectively to the counter 24 Bit_Time_Count and to the register 25 Bit_Time_Reg and enables comparison of their contents. Moreover, the input of the comparator 26 connected to the register 25 Bit_Time_Reg multiplies the contents of the register 25 by a constant factor $t_{low}$ before performing the comparison operation. Based on the comparison result, the comparator 26 activates/deactivates the masking signal MASK.

Similarly, the second comparator 27 enables comparison between the contents of the counter 24 and the register 25, to both of which it is connected by the two inputs. The input of the comparator 27 connected to the register 25 multiplies the contents of the register 25 by a constant factor $t_{high}$ before performing the comparison operation. On the basis of the comparison result, the comparator 27 activates/deactivates the end of message signal IMS_Detect.

Figure 2B:
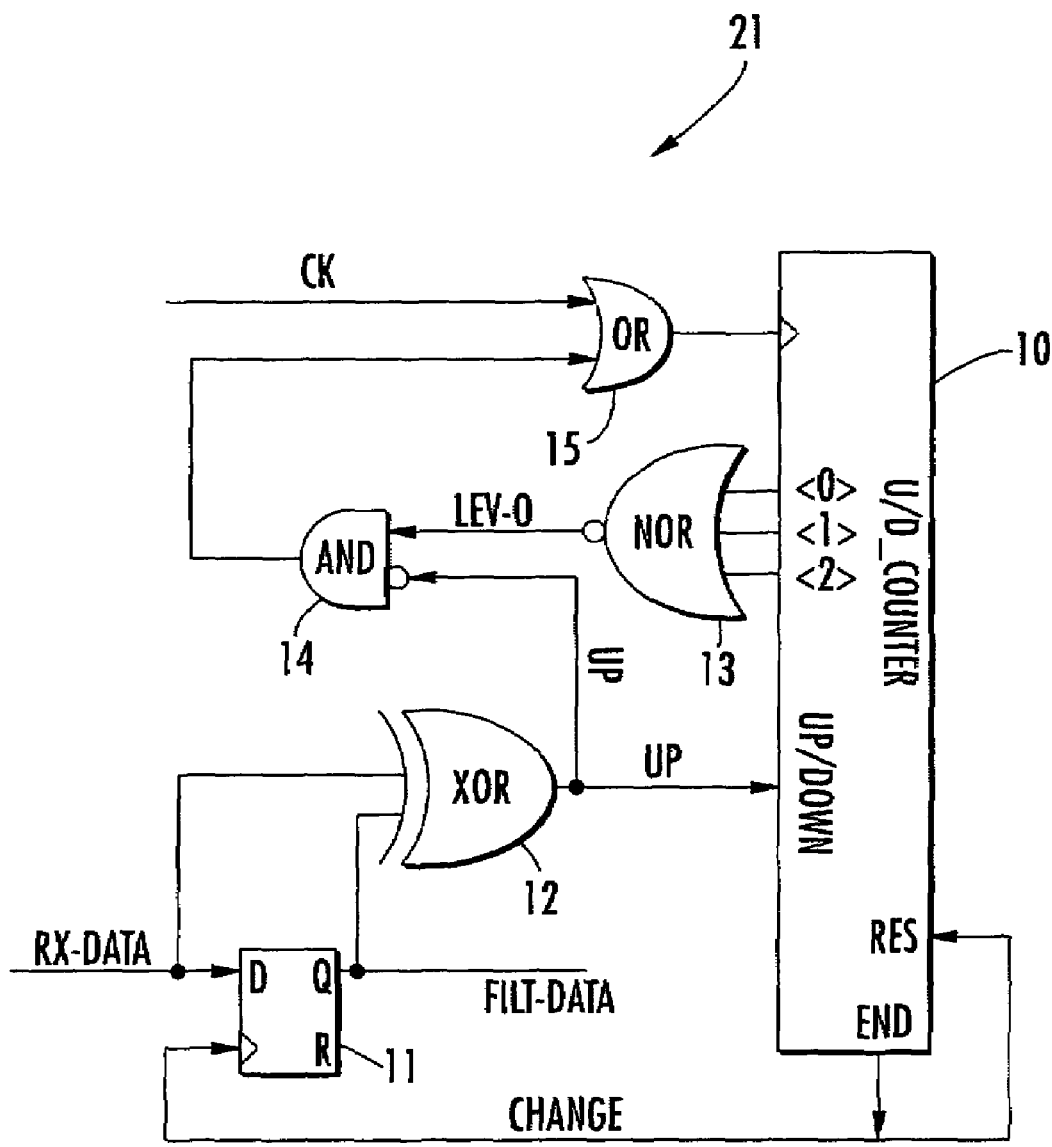

The behavior of the decoder 20 according to the present invention will now be described, block by block. FIG. 2b shows one implementation of the input filter 21 In_Filter. This filter substantially comprises an up-down counter U/D_Counter 10, which in this example is of the 4-bit type, and a sequential logic network.

Figure 3A:
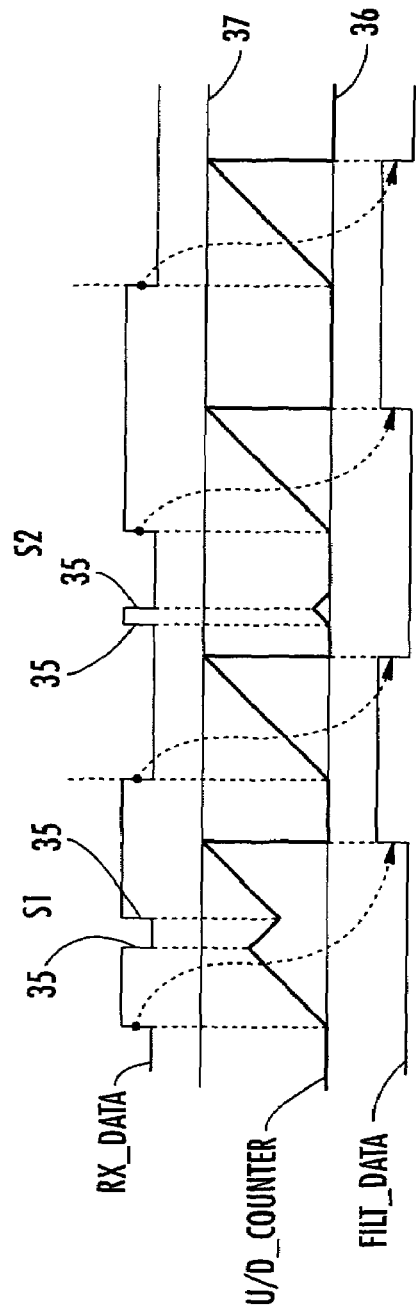

FIG. 3a shows the waveforms of the filter 21 In_Filter given in FIG. 2a. The signal RX_DATA represents the flow of data input in the filter 21. The signal comprises bits, for example S1 and S2, and possibly noise in the form of pulses, for example, which determine the undesired transitions 35.

Figure 3B:
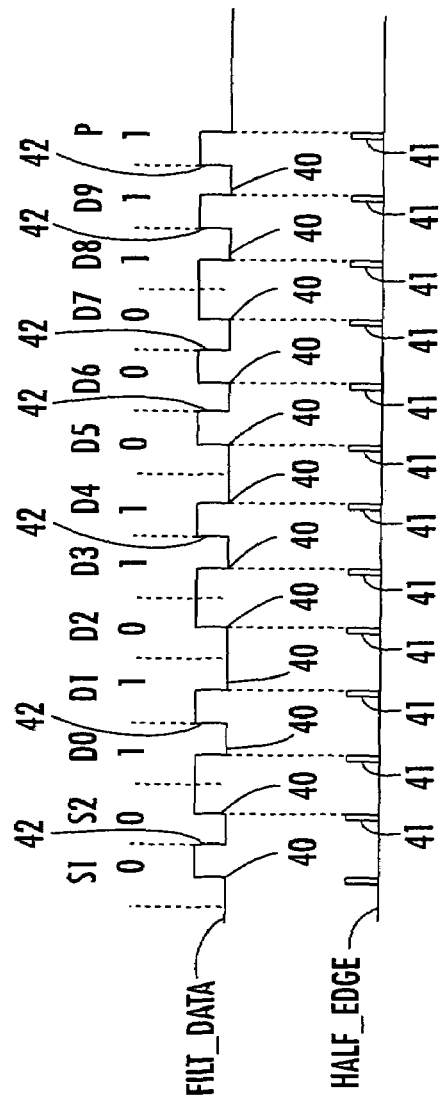

A transition of the signal RX_DATA which makes its value opposite to that of FILT_DATA, causes the up/down counter 10 to move up, the contents of which are indicated in FIG. 3b with U/D_Counter. This counter, for example, counts the cycles of the clock signal CK. Each subsequent transition of the input RX_DATA causes a change in direction of the counting of the counter. The counter 10 is decreasing if the input and output are the same, and the counter 10 is increasing if the input and output differ.

For this purpose, the signals RX_DATA and FILT_DATA, taken at the input D and at the output Q respectively of a flip-flop 11, are sent to the inputs of a gate EX_OR 12. A high active signal UP is produced at the output of the gate when RX_DATA and FILT_DATA differ. The signal UP, when it is at a high level, is such as to put the counter 10 in a state of up-count, through the UP/DOWN input. Vice versa, when the signal UP is at a low level, it puts the counter in a state of down-count.

If the counter 10 reaches the initial zero level 36, it stops and the output FILT_DATA of the flip-flop 11 remains unaltered. In this case, the input RX_DATA has had an even number of transitions and has returned to its initial condition, the output does not switch and, therefore, the input transitions 35 which took place with the counter in movement, have been rejected.

However, if the counter U/D_Counter 10 reaches the final count level 37, a high active signal CHANGE, output by the gate END of the counter 10, resets the counter 10 through the input RES and simultaneously, through the flip-flop 11, causes switching of the output FILT_DATA. In this case, an odd number of input transitions has occurred, maintaining a logic value opposite to the output value for a sufficiently long average time period.

Once reset, the counter 10 stops because the gate NOR 13, when all the bits of the counter (from the least significant respectively: <0>, <1>, <2>) are equal to zero, produces a high active signal LEV_0 which blocks the counting signal CK through the OR gate 15. A logic AND gate 14 ends blocking of the clock CK when the signal UP is reactivated.

The maximum duration of the rejected pulse 35 corresponds to the time the counter takes to reach the final level 37 starting from the zero level 36. This time, which is also equivalent to the minimum delay with which the input information is transferred to the output, is preferably equal to 2 μs.

The filtered data FILT_DATA are received by the first state machine 30 Center_Detect which selects the transitions corresponding to the bit center of the filtered signal FILT_DATA. Similar to the description given concerning the B_Manchester packet illustrated in FIG. 1a, the signal FILT_DATA shown in FIG. 3b comprises a first sequence of transitions 40 at the center of each bit, which will also be called central transitions 40, and a second sequence of transitions 42 present only between adjacent bits having the same logic value, which will be called initial transitions 42. It should be noted that in FIG. 3b, given only as an example, the packet to be decoded contains an acceleration value represented by 10 bits (D0–D9).

According to the present invention, the first state machine 30 selects the central transitions 40. Advantageously, the selection comprises a masking step when the initial transitions 42 are eliminated or rejected, which is not useful for decoding, so as to generate the signal HALF_EDGE.

The signal comprises pulses 41 corresponding to the transitions 40 at the center of each bit S1,S2,D0, . . . , P of FILT-DATA. The pulses in this embodiment have a timing width comparable with the period of the clock signal CK. The pulses 41 of the HALF_EDGE increase the counter Bit_Count 23, in this example of the 4-bit type. The counter counts the number of bits of packet 1 already received and is read by the first state machine 30. On the basis of the contents of the counter 23, the state machine 30 generates the signal BIT_0 which, during reception of packet 1, is a high level and which is activated (low level) when a value 0 is read in the counter 23.

A pulse 41 of the signal HALF_EDGE also resets and starts up the counter Bit_Time_Count 24, which is increased at every cycle of the clock signal CK. In a preferred embodiment the counter 24 is of the 8-bit type. A subsequent pulse 41 of the signal HALF_EDGE causes loading of the contents of the counter Bit_Time_Count 24 in the register Bit_Time_Reg 25 immediately before resetting and restarting the counter 24.

The register Bit_Time_Reg 25, pre-loaded with its maximum activation value by the signal BIT_0, therefore contains a number $N_{n-1}$ of cycles of the clock signal CK measured by the counter 24 and occurring between the last pair of selected adjacent central transitions 40 (pulses 41).

The number $N_{n-1}$ thus represents a measurement of the time interval elapsing between the last pair of selected adjacent central transitions 40. On the other hand, the counter 24 contains, at any given instant, the number of clock cycles N, elapsed after the last selected central transition 41 (pulse 40).

The two measurements $N_n$ and $N_{n-1}$ are compared in the two comparators 26 and 27. In particular, the comparator 27 is used to detect the end-of-packet 1. The end-of-packet 1 is detected when the contents of the counter 24 exceed, by a suitable pre-established quantity, the contents of the register 25 which contains the duration of the last bit received. In formula, an end-of-packet 1 is detected if:

$$N_n \geq t_{high} * N_{n-1}$$

where $t_{high}$ is a real number, greater than 1, representing a proportionality factor. When the above relation is verified, the comparator 27 puts the end-of-packet signal IMS_Detect on a high active level.

In a preferred embodiment, the proportionality factor $t_{high}$ is approximately equal to 2, in such a way that when the contents $N_n$ of the bit time counter 24 exceed by 200% the contents $N_{n-1}$ of the register 25, the end-of-packet 1 is signaled with activation of the signal IMS_Detect (high level). When this happens, FILT_DATA has had no more transitions 40 for a duration of 2 bits starting from the center of the last bit received, that is, 1.5 bits after the end of the last bit received. Therefore, the signal IMS_Detect (Inter Message Space Detection) represents the end of data packet 1, since the filtered data FILT_DATA remains silent for a length of time 1.5 times greater than the duration of the last bit received.

By varying the quantity $t_{high}$, it is possible to choose how long to wait before signaling the end of the packet. If the factor $t_{high}$ is near 1, a bit with a duration slightly higher than the previous bit (for example, caused by jitter) may determine an erroneous end-of-packet signal. A factor $t_{high}$ with a slightly higher value, for example between 1.5 and 3, permits a certain margin in possible bit time variability between adjacent bits.

On the contrary, a high factor $t_{high}$, determines a certain delay in decoding. In any case, the factor cannot be arbitrary. It has an upper limit correlated to the minimum spacing IMS between adjacent packets 1. It should be noted that initialization of the register Bit_Time_Reg 25, at its maximum value, provided by activation of signal BIT_0, makes it possible, during reception of the first bit of packet 1, to avoid erroneous recognition of end-of-packet when the contents of the counter 24 exceed the contents of the register 25 by 200% (in this example).

The signal IMS_Detect resets the contents of the register 23 and, at the same time, enables the SLEEP signal (high active) by way of the second state machine 31. The SLEEP signal remains at a high level during the entire rest period between two successive packets 1, masking the clock CK, through the logic OR gate 32, to the counter 24 Bit_Time_Count.

A possible implementation of the second state machine End_Of_Msg 31 according to the invention is schematically represented in FIG. 5a. The machine End_Of_Msg 31 comprises a first 50 and a second 51 D-type flip-flop connected in cascade, and a logic OR gate 52. The first and the second flip-flop 50 and 51 are clocked by an output signal from the logic OR gate 52. Moreover, an input D of the first flip-flop 50 receives the end-of-packet signal IMS-Detect and an output Q of the second flip-flop 51 makes the SLEEP signal available. The SLEEP signal is combined with the clock signal CK in the logic OR gate 52. The first and second flip-flops 50 and 51 are provided with a reset input R so as to be reset by the signal HALF_EDGE.

The second state machine 31 is such as to put the SLEEP signal at a high level following activation of the end-of-packet signal IMS_Detect, and to put it back at a low logic level following a pulse 40 of the signal HALF_EDGE, corresponding to the center of the first bit (S1) of the next packet 1.

Advantageously, by dimensioning the bit time register 25 in such a way that it is smaller than the bit time counter 24, it is possible to prevent the counter 24 from reaching a condition of arithmetic overflow once the packet 1 has ended. For example, if $t_{high}$=2 and the register 25 has one bit less than the counter 24, the counter 24 will not be able to overflow because, before that happens, the comparator 27 detects the end-of-packet (the SLEEP signal is activated) and stops the counter 24.

The second comparator 26 compares the contents $N_n$ of the bit time counter 24 and the contents $N_{n-1}$ of the bit time register 25 in order to estimate a time interval in which, starting from the last selected central transition 40, it is probable that an initial transition 42 will take place. This happens in order to mask the initial transition 42 and select the central transition 40 immediately following.

The comparator 26 produces the mask signal MASK, which receives a high logic level when:

$$N_n \geq t_{low} * N_{n-1}.$$

In a preferred embodiment, $t_{low}$ is approximately equal to 0.75, so that, when the contents of the bit time counter 24 exceed the contents of the register 25 by 75%, in other words when it is likely that an instant substantially equidistant between the beginning and the center of the bit being received is reached, the MASK signal (high logic level) is activated.

The MASK signal enables masking of the transition 42 at the beginning of the bit by the state machine 30, in order to produce a signal (HALF_EDGE) which contains only transitions 41 corresponding to the center of the bits of the packet 1.

As can be seen in FIG. 5b, the state machine 30 creates, from the clock signal CK and the signal FILT_DATA, through the flip-flop 53 and the logic gate AND 54, the signal RISE_EDGE containing pulses corresponding to the rising transitions of the FILT_DATA signal. Moreover, it also creates, through the flip-flop 53 and the logic gate EX_OR 55, the signal ANY_EDGE which contains pulses corresponding to all the transitions of the signal FILT_DATA.

By applying a logic AND in the gate 56 to the signals ANY_EDGE and MASK, the pulses of the signal ANY_EDGE which do not correspond to the mid-bit transitions 40 of the packet 1 are eliminated. This happens because the signal MASK becomes high active at a point equidistant between the beginning of the bit and its center, thus enabling masking of any initial transition 42.

When the first two bits S1 and S2 of the message 2 are received, in order to produce the output signal HALF_EDGE, the multiplexer MUX 57 selects (i.e., it transmits on its output) the first two pulses of the signal RISE_EDGE. It should be remembered that the signal RISE_EDGE contains pulses corresponding to rising transitions and, therefore, the pulses selected by the multiplexer 57 correspond to the center of the bits. The first two bits S1 and S2 of every packet 1 have logic values 0.

However, when the successive bits are received, the multiplexer 57 selects the pulse at the center of the bit output by the logic gate AND 56. It should be noted that the selection carried out by the multiplexer 57 is made because the signal output by the logic gate 56 can be used for generation of the signal HALF_EDGE only after reception of the second bit of the packet 1, since the first two bits are used for initialization of the counter Bit_Time_Count 24 and the register Bit_Time_Reg 25.

In a preferred embodiment, such as that illustrated in FIG. 5b, the selection control SEL of the inputs of the multiplexer 57 is created through reading of the 4-bit counter Bit_Count 23. In particular, a logic NOR performed by the gate NOR3 58 provides a high active output signal BIT_0_1 if the three first most significant bits of the counter 23 (Bit_Count<3>, Bit_Count<2>, Bit_Count<1>) are all zero. In this case, the counter Bit_Count 23 contains a 0 or a 1, so that the multiplexer selects input 0. Otherwise, it selects input 1. Finally, by applying another logic NOR (gate NOR2 59) to the signal output by gate 58 NOR3 and the least significant bit of the counter 23, the signal BIT_0 is produced which is high active when the counter 23 contains value 0.

As illustrated in FIG. 2a, the signals RISE_EDGE, BIT_0 and HALF_EDGE are sent to the shift register Shift_Reg 28. The register 28, based on the signals RISE_EDGE and HALF_EDGE, performs a final decision step which makes it possible to associate a logic value 0 bit to a rising central transition and a logic value 1 bit to a falling central transition.

In greater detail, the register 28 uses the signal HALF_EDGE as a timing clock to sequentially acquire the denied logic value carried by the signal RISE_EDGE. It should be remembered that the signal RISE_EDGE contains all the rising pulses of the Manchester binary data signal to be decoded.

Consider the case in which the signal RISE_EDGE presents a pulse (logic value 1 of RISE_EDGE) simultaneously with a pulse 41 of HALF_EDGE. This implies the presence of a rising central transition, and thus a 0 logic in the signal FILT_DATA. In this case, the register 28 acquires a logic 0, inverting the logic value associated to the pulse of the signal RISE_EDGE.

Furthermore, consider the case in which the signal RISE_EDGE does not present any pulse (logic value 0 of RISE_EDGE) simultaneously with a pulse 41 of HALF_EDGE. This implies the presence of a falling central transition, and thus a 1 logic, in the FILT_DATA signal. In this case, the register 28 acquires a logic 1, inverting the logic value associated to the signal RISE_EDGE.

Furthermore, the shift register Shift_Reg 28 is reset by the signal BIT_0 at the end of the packet, so as to be clear at the beginning of acquiring the next message 2. At the end-of-packet 1, more precisely on activation of the signal IMS_Detect, the contents of the register Shift_Reg 28 are loaded in the output register Out_Reg 29 which makes the decoded packet available.

Figure 4:
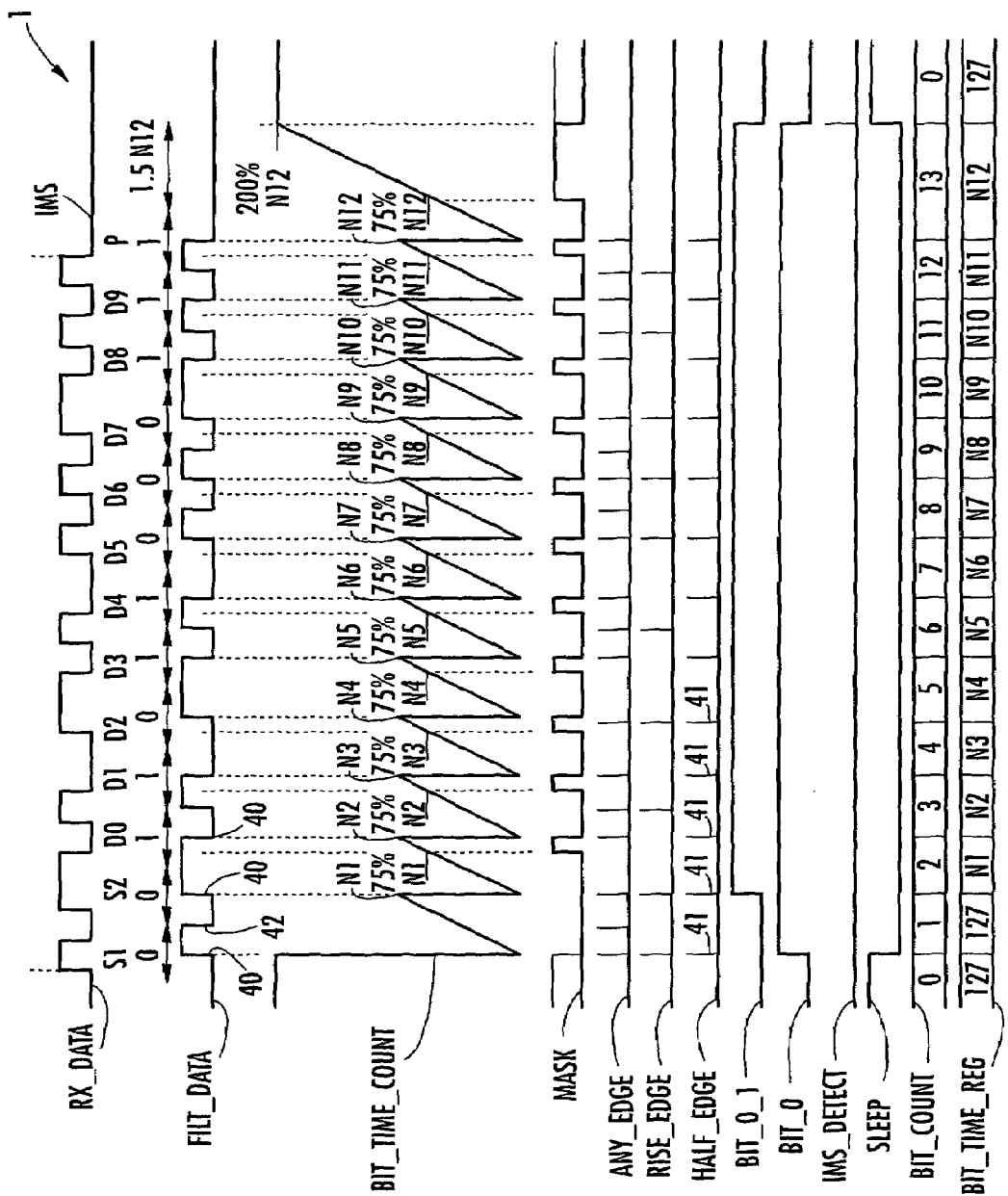

FIG. 4 shows, for completion of description, the waveforms of the signals during operation of the decoder according to the present invention. In this figure, for the sake of simplicity, it is assumed that the received signal RX_DATA is not affected by noise. Consequently, the signal FILT_DATA represents its delayed repetition.

Furthermore, as in FIG. 3b, in FIG. 4 the number of useful bits in packet 1 is 10 (D0–D9). In the design of the decoder 20 shown in FIG. 2a, attention must only be paid to dimensioning the shift register 28 and the output register 29 in such a way that they can contain all the bits in a packet 1.

The signal Bit_Time_Count shows the contents of the counter 24 during decoding of the packet 1. N1, N2 . . . indicate the values (measurements) contained in the counter Bit_Time_Count 24 before its resetting brought about by the pulses of the signal HALF_EDGE. As can be seen in the figure, when the contents of the counter 24 Bit_Time_Count exceed the contents of the register 25 Bit_Time_Reg by 75%, the signal MASK takes on a high logic level. Resetting of the counter 24 Bit_Time_Count puts the signal MASK at a low level once again.

In the proposed approach, decoding is carried out by determining the central transitions 40 of the data signal RX_DATA to be decoded. In order to determine the transitions, each successive central transition 40 is selected on the basis of the measurement N of the time interval between the couple of adjacent central transitions 40 which immediately precede the successive central transition 40.

In particular, an initial transition 42, i.e., not central, which immediately precedes the successive central transition 40 to be selected, is ignored or masked. More particularly, masking eliminates an initial transition 42 which falls within a time interval measured from the last central transition and having a duration proportional to the measure N of the time interval according to a proportionality factor greater than 0.5 and less than 1, which in a preferred embodiment is approximately equal to 0.75. In particular, this latter choice makes it possible to tolerate variations of 25% in the bit time, between successive bits.

If the signal RX_DATA to be decoded is affected by noise which causes shifting of the bit transitions (phase jitter), the tolerance guaranteed by the decoder 20 according to this invention can, in any case, enable correct decoding.

As previously described, according to the present invention, each bit is decoded using the measure N of the duration of the previous bit as a time reference. It follows that, unlike the known and previously cited decoding methods, the decoders according to this invention do not need a frequency reference having high precision and stability.

Moreover, the decoders according to this invention do not necessarily require a precise relation between the clock frequencies used in sending and receiving and, therefore, they tolerate even very small variations in bit time both between different packets 1 and within the same packet 1.

Consider also that, having reduced the criticality of the frequency reference to the receiver and the transmitter, it is possible to use low cost frequency references. The only requirement for correct decoding is a sufficiently stable local frequency reference CK during reception of successive pairs of bits.

In the particular preferred embodiment described, this duration is also advantageously used to detect the end-of-packet 1. In the example described, since the bit time is equal to 8 μs and the clock signal CK has a frequency equal to 5 MHz, the measurement N of an interval between successive central transitions 40 is carried out by counting an average of forty clock cycles between each pair of central transitions 40.

Naturally, it is possible to choose at will the frequency of the clock signal CK. The higher the frequency, the higher the precision with which the measurement N of the time interval between two adjacent central transitions 40 will be carried out. If the ratio between the clock frequency and the bit transmission rate is too low, for example equal to 4, the decoder works but it loses much of its tolerance to variations in bit time between successive bits and to noise. In a preferred embodiment, the ratio is at least equal to 10. In particular, in another preferred embodiment, the ratio is a number between 10 and 100, for example 40.

It should be observed that it is not strictly necessary that the single block functions be provided in the way described above, it should furthermore be observed that it is possible to add numerous accessory functions. For example, there are numerous methods known to provide the input filter In_Filter 21, which could even be omitted.

It is also possible to add functions to control the parity of packet 1 or diagnostic functions to control the exact number of bits of a packet 1. In the latter case, it could be necessary to verify that the contents of the counter Bit_Count 23 correspond to a pre-established value at the time when the end of message 2 is detected by the signal IMS_Detect.

It is possible to control the duration of the various bits more carefully, for example by verifying that the distance between two bit centers does not exceed the duration of the previous bit by more than 125%. For this purpose, it is sufficient to add another comparator which compares the contents of the counter 24 Bit_Time_Count with 125% of the contents of the register 25 Bit_Time_Reg.

Another variation could be to compare the relative duration of the various bits less severely, accepting as the center of the bit the first of the following two events: (a) what happens after the counter Bit_Time_Count exceeds the register Bit_Time_Reg by 75%, or (b) the second transition of the filtered data following the last bit-center. In this way, a bit substantially shorter than the one preceding it can be accepted, provided that it can pass the input filter 21.

Naturally, in order to satisfy contingent and specific requirements, a person skilled in the art may apply to the above-described decoding method and decoder many modifications and variations, all of which are incidentally included within the scope of protection of the invention as defined by the appended claims.

That which is claimed is:

1. A method for decoding a Manchester encoded binary data signal, the method comprising:
    receiving the Manchester encoded binary data signal, the Manchester encoded binary data signal comprising a sequence of central bit transitions and a sequence of initial bit transitions;
    generating a local clock signal; and
    determining the sequence of central bit transitions by
    measuring a time interval between a pair of adjacent central bit transitions, the time interval being expressed as a number of cycles of the local clock signal, and
    selecting each successive central bit transition based upon the time interval measured between the pair of adjacent central bit transitions which immediately precede the successive central bit transition.

2. A method according to claim 1, wherein selecting each successive central bit transition comprises a masking step for eliminating any initial bit transition that immediately precedes the successive central bit transition.

3. A method according to claim 2, wherein the masking step eliminates any initial bit transition occurring in a time interval measured starting from a last selected central bit transition and having a duration proportional to the time interval according to a proportionality factor greater than 0.5 and less than 1.

4. A method according to claim 3, wherein the proportionality factor is between 0.7 and 0.8.

5. A method according to claim 4, wherein the proportionality factor is equal to about 0.75.

6. A method according to claim 1, wherein the Manchester encoded binary data signal is grouped in packets of Manchester encoded bits.

7. A method according to claim 6, further comprising detecting an end-of-packet on a last pair of selected central bit transitions based upon the measured the time interval.

8. A method according to claim 7, wherein the end-of-packet is detected when central bit transitions are not selected for a time interval measured starting from the last selected central bit transition, and having a duration proportional to the time interval according to a second proportionality factor greater than 1 and with an upper limit based on a reduced time between successive packets.

9. A method according to claim 8, wherein the second proportionality factor is equal to about 2.

10. A method according to claim 1, wherein the central bit transitions comprise rising transitions and falling transitions; and further comprising a final decision step where a bit with a value 0 is associated to a rising central bit transition and a bit with a value 1 is associated to a falling central bit transition.

11. A method according to claim 1, further comprising filtering the Manchester encoded binary data signal before determining the sequence of central bit transitions.

12. A method according to claim 1, wherein the time interval comprises at least four local clock signal cycles.

13. A method according to claim 1, wherein the time interval comprises at least ten local clock signal cycles.

14. A method according to claim 1, where the time interval comprises at least forty local clock signal cycles.

15. A method for decoding an encoded binary data signal having a sequence of central bit transitions and a sequence of initial bit transitions, the method comprising:
    generating a clock signal;
    generating a first signal having pulses corresponding to the sequence of central bit transitions, the first signal being obtained from the encoded binary data signal;
    measuring a time interval between two adjacent central bit transitions;
    generating a second signal having pulses corresponding to both the sequence of central bit transitions and the sequence of initial bit transitions; and
    selecting each successive central bit transition and, eliminating from the second signal, pulses corresponding to an initial bit transition which precedes each successive central bit transition based upon a time interval measured between a pair of selected adjacent central bit transitions which precede the successive central bit transition.

16. A method according to claim 15, further comprising storing a number representing the time interval, the number being equal to the number of cycles of the local clock signal occurring within the time interval.

17. A method according to claim 16, wherein the measuring is performed using a counter; and further comprising comparing the stored number of the time interval elapsing between a last pair of selected adjacent central bit transitions with a counting value of the counter, the counting value corresponding to the number of clock cycles elapsing from a last selected central bit transition.

18. A method according to claim 17, further comprising generating a masking signal when the counting value exceeds a pre-established value proportional to the stored number according to a proportionality factor greater than 0.5 and less than 1.

19. A method according to claim 18, further comprising combining the masking signal and the second signal for eliminating from the second signal pulses corresponding to the initial bit transitions and for generating the first signal.

20. A method according to claim 17, wherein the encoded binary data signal is a packet signal; and further comprising:
comparing the stored number of the time interval between the last pair of selected adjacent central bit transitions, with a counting value of the counter corresponding to the number of clock cycles occurring from a last selected central bit transition; and
generating an end-of-packet signal when the counting value exceeds a pre-established value proportional to the stored number according to a second proportionality factor greater than 1 and with an upper limit depending on a reduced distance between successive packets.

21. A method according to claim 20, further comprising preventing an increase in the counter once the end-of-packet has been detected by generating, starting from the end-of-packet signal, a signal for preventing the increase.

22. A method according to claim 15, further comprising generating a third signal having pulses corresponding to rising transitions of the encoded binary data signal.

23. A method according to claim 22, further comprising using the first signal as a clock signal to sequentially acquire information carried by the third signal.

24. A decoder for decoding a Manchester encoded binary data signal, the Manchester encoded binary data signal having a sequence of central bit transitions and a sequence of initial bit transitions, the decoder comprising:
a generator for generating a local clock signal;
a first state machine for generating a first signal having pulses corresponding to the sequence of central bit transitions, the first signal being obtained from the Manchester encoded binary data signal; and
a counter for measuring a time interval between two adjacent central bit transitions, said counter being increased by the local clock signal;
said first state machine comprising
signal means for generating a second signal having pulses corresponding to both the sequence of central bit transitions and the sequence of initial bit transitions, and
masking means for selecting each successive central bit transition and eliminating from the second signal pulses corresponding to an initial bit transition which precedes each successive central bit transition based upon a time interval measured between a pair of selected adjacent central bit transitions which immediately precede the successive central bit transition to be selected.

25. A decoder according to claim 24, further comprising a memory connected to said counter for storing a number representing the time interval, the number being equal to the number of cycles of the local clock signal occurring within the time interval.

26. A decoder according to claim 25, further comprising a first comparator for comparing the stored number of the time interval elapsing between a last pair of selected adjacent central bit transitions with a counting value of said counter, the counting value corresponding to the number of clock cycles elapsing from a last selected central bit transition.

27. A decoder according to claim 26, wherein said first comparator generates a masking signal when the counting value exceeds a pre-established value proportional to the stored number according to a proportionality factor greater than 0.5 and less than 1.

28. A decoder according to claim 27, wherein said masking means comprises a logic gate for combining the masking signal and the second signal for eliminating from the second signal pulses corresponding to the initial bit transitions and for producing the first signal.

29. A decoder according to claim 26, wherein the Manchester encoded binary data signal is a packet signal; and further comprising a second comparator for comparing the stored number of the time interval between the last pair of selected adjacent central bit transitions, with a counting value of said counter corresponding to the number of clock cycles occurring from a last selected central bit transition, said second comparator generating an end-of-packet signal when the counting value exceeds a pre-established value proportional to the stored number according to a second proportionality factor greater than 1 and with an upper limit depending on a reduced distance between successive packets.

30. A decoder according to claim 29, further comprising a second state machine for preventing an increase in said counter once the end-of-packet has been detected, said second state machine generating, starting from the end-of-packet signal, a signal for preventing the increase.

31. A decoder according to claim 24, wherein said signal means comprise a sequential logic network timed by the local clock signal.

32. A decoder according to claim 31, further comprising second signal means for generating a third signal comprising pulses corresponding to rising transitions of the Manchester encoded binary data signal.

33. A decoder according to claim 32, further comprising a shift register which uses the first signal as a clock signal to sequentially acquire information carried by the third signal.

34. A decoder according to claim 24, wherein the Manchester encoded binary data signal is a packet signal.

35. A decoder according to claim 24, further comprising an input filter connected to said first state machine, said input filter for filtering the Manchester encoded binary data signal before decoding.

36. A decoder for decoding an encoded binary data signal having a sequence of central bit transitions and a sequence of initial bit transitions, the decoder comprising:
a generator for generating a clock signal;
a first state machine for generating a first signal having pulses corresponding to the sequence of central bit transitions, the first signal being obtained from the encoded binary data signal; and
a counter for measuring a time interval between two adjacent central bit transitions, said counter being increased by the local clock signal;
said first state machine also for
generating a second signal having pulses corresponding to both the sequence of central bit transitions and the sequence of initial bit transitions, and
selecting each successive central bit transition and eliminating from the second signal pulses corresponding to an initial bit transition which precedes each successive central bit transition based upon a time interval measured between a pair of selected adjacent central bit transitions which immediately precede the successive central bit transition.

37. A decoder according to claim 36, further comprising a memory connected to said counter for storing a number representing the time interval, the number being equal to the number of cycles of the local clock signal occurring within the time interval.

38. A decoder according to claim 37, further comprising a first comparator for comparing the stored number of the time interval elapsing between a last pair of selected adjacent central bit transitions with a counting value of said counter, the counting value corresponding to the number of clock cycles elapsing from a last selected central bit transition.

39. A decoder according to claim 38, wherein said first comparator generates a masking signal when the counting value exceeds a pre-established value proportional to the stored number according to a proportionality factor greater than 0.5 and less than 1.

40. A decoder according to claim 39, wherein said first state machine combines the masking signal and the second signal for eliminating from the second signal pulses corresponding to the initial bit transitions and for producing the first signal.

41. A decoder according to claim 38, wherein the encoded binary data signal is a packet signal; and further comprising a second comparator for comparing the stored number of the time interval between the last pair of selected adjacent central bit transitions, with a counting value of said counter corresponding to the number of clock cycles occurring from a last selected central bit transition, said second comparator generating an end-of-packet signal when the counting value exceeds a pre-established value proportional to the stored number according to a second proportionality factor greater than 1 and with an upper limit depending on a reduced distance between successive packets.

42. A decoder according to claim 41, further comprising a second state machine for preventing an increase in said counter once the end-of-packet has been detected, said second state machine generating, starting from the end-of-packet signal, a signal for preventing the increase.

43. A decoder according to claim 36, wherein said state machine generates a third signal having pulses corresponding to rising transitions of the encoded binary data signal.

* * * * *